United States Patent
Shieh et al.

(10) Patent No.: US 8,932,957 B2
(45) Date of Patent: Jan. 13, 2015

(54) METHOD OF FABRICATING A FINFET DEVICE

(71) Applicant: Taiwan Semiconductor Manufacturing Company, Ltd., Hsin-Chu (TW)

(72) Inventors: Ming-Feng Shieh, YongKang (TW); Chen-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 13/892,945

(22) Filed: May 13, 2013

(65) Prior Publication Data

US 2014/0273464 A1 Sep. 18, 2014

Related U.S. Application Data

(60) Provisional application No. 61/777,736, filed on Mar. 12, 2013.

(51) Int. Cl.
*H01L 21/311* (2006.01)
*H01L 21/8234* (2006.01)
*H01L 29/66* (2006.01)

(52) U.S. Cl.
CPC .... *H01L 21/823431* (2013.01); *H01L 29/6681* (2013.01)
USPC .......................................... 438/700; 438/702

(58) Field of Classification Search
USPC ................................................ 438/700, 702
See application file for complete search history.

(56) References Cited

U.S. PATENT DOCUMENTS

| | | | | |
|---|---|---|---|---|
| 6,063,688 A | * | 5/2000 | Doyle et al. | 438/424 |
| 7,560,390 B2 | * | 7/2009 | Sant et al. | 438/717 |
| 7,662,721 B2 | * | 2/2010 | Manger et al. | 438/717 |
| 7,842,601 B2 | * | 11/2010 | Lee et al. | 438/622 |
| 7,862,962 B2 | | 1/2011 | Shieh et al. | |
| 7,989,355 B2 | | 8/2011 | Shieh et al. | |
| 8,039,179 B2 | | 10/2011 | Shieh et al. | |
| 8,110,466 B2 | | 2/2012 | Shieh et al. | |
| 8,241,823 B2 | | 8/2012 | Shieh et al. | |
| 8,338,310 B2 | * | 12/2012 | Jung et al. | 438/717 |
| 2007/0063276 A1 | * | 3/2007 | Beintner et al. | 257/347 |
| 2007/0161245 A1 | * | 7/2007 | Rathsack et al. | 438/689 |
| 2007/0249170 A1 | * | 10/2007 | Kewley | 438/706 |
| 2010/0144153 A1 | * | 6/2010 | Sills et al. | 438/696 |
| 2012/0100673 A1 | | 4/2012 | Shieh et al. | |

* cited by examiner

*Primary Examiner* — Karen Kusumakar
(74) *Attorney, Agent, or Firm* — Haynes and Boone, LLP

(57) ABSTRACT

A method includes receiving a substrate having an etch stop layer deposited over the substrate and a dummy mandrel layer deposited over the etch stop layer, forming a plurality of hard mask patterns using a hard mask layer deposited over the dummy mandrel layer, wherein the hard mask patterns includes a first dimension adjusted by a predetermined value, depositing a first spacer layer over the hard mask patterns, wherein a thickness of the first spacer layer is adjusted by the predetermined value, forming a plurality of spacer fins in the dummy mandrel layer, wherein the spacer fins include a second dimension, a first space, and a second space, performing a first fin cut process to remove at least one spacer fin, adjusting the second dimension to a target dimension, performing a second fin cut process, and forming a plurality of fin structures in the substrate by etching the spacer fins.

20 Claims, 10 Drawing Sheets

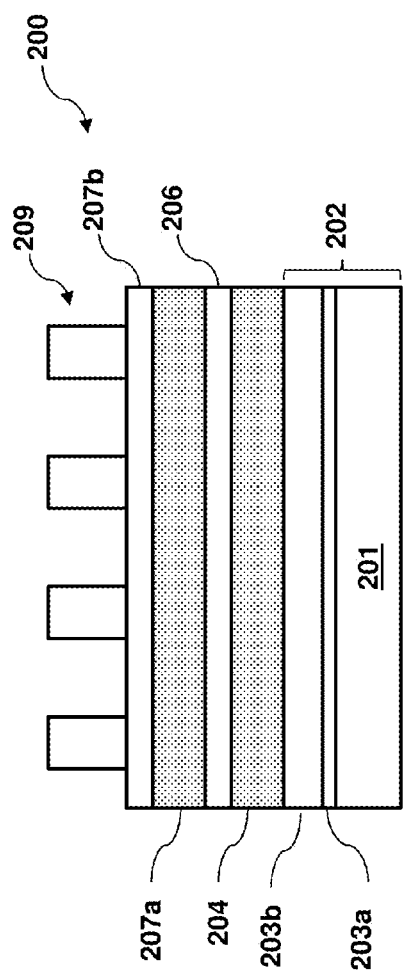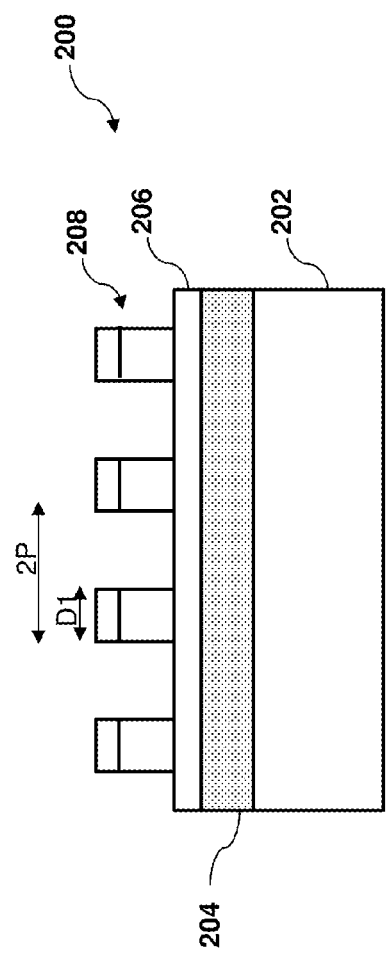

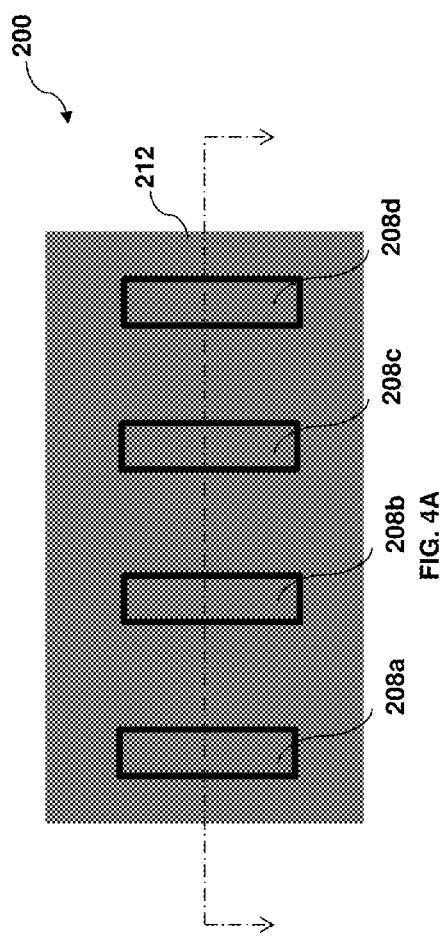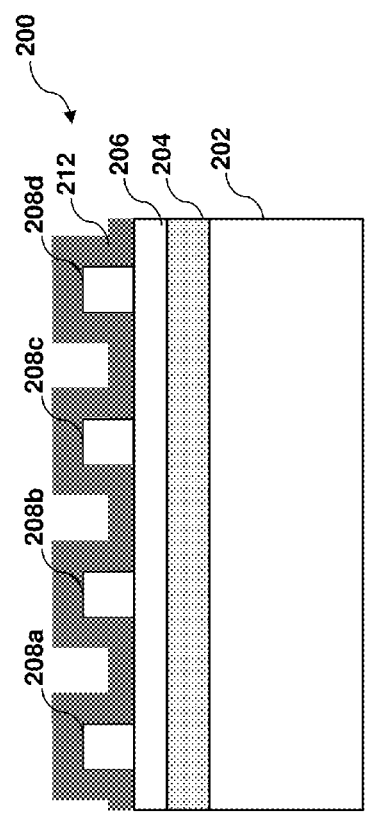

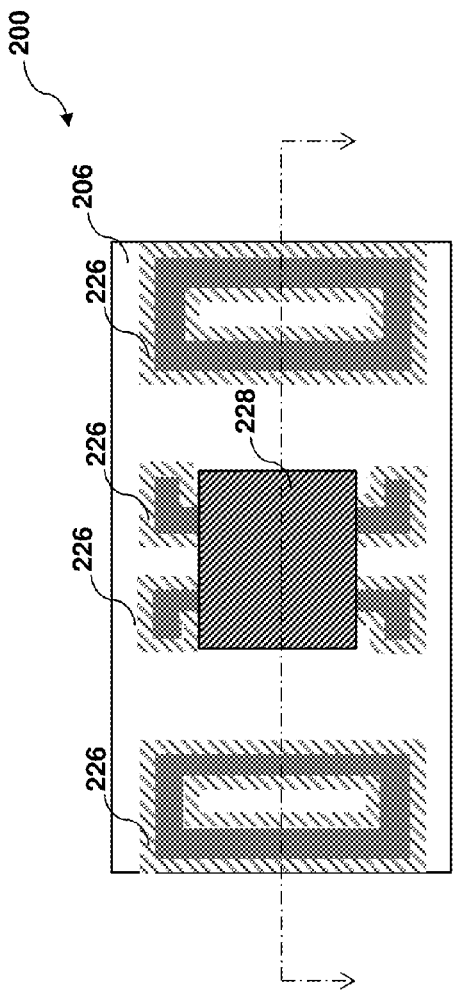
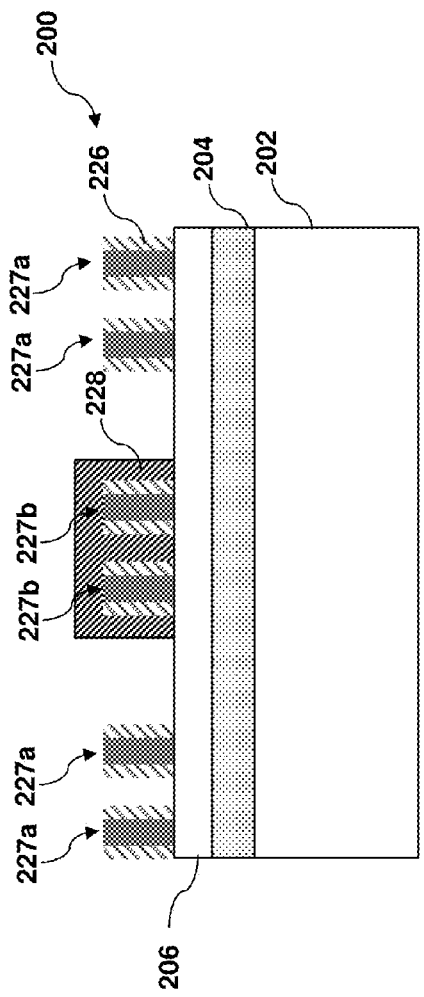
FIG. 9A
FIG. 9B

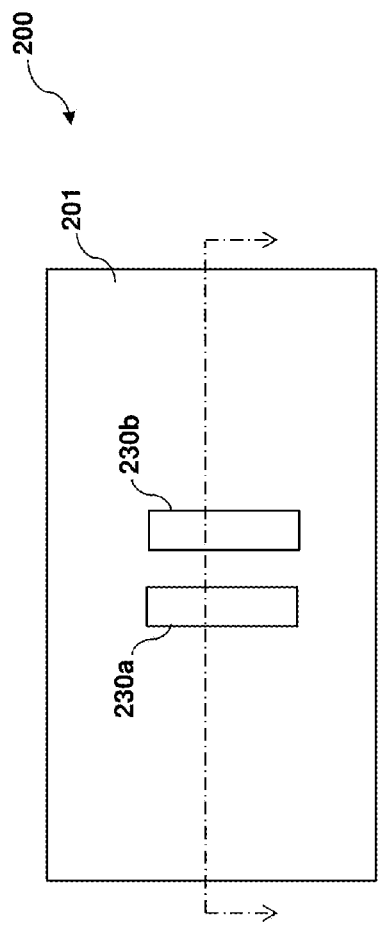
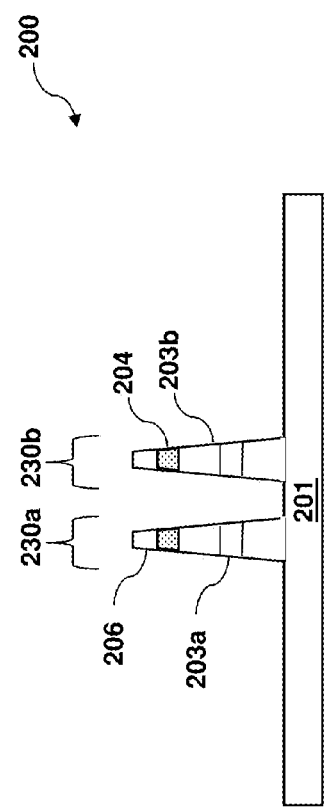

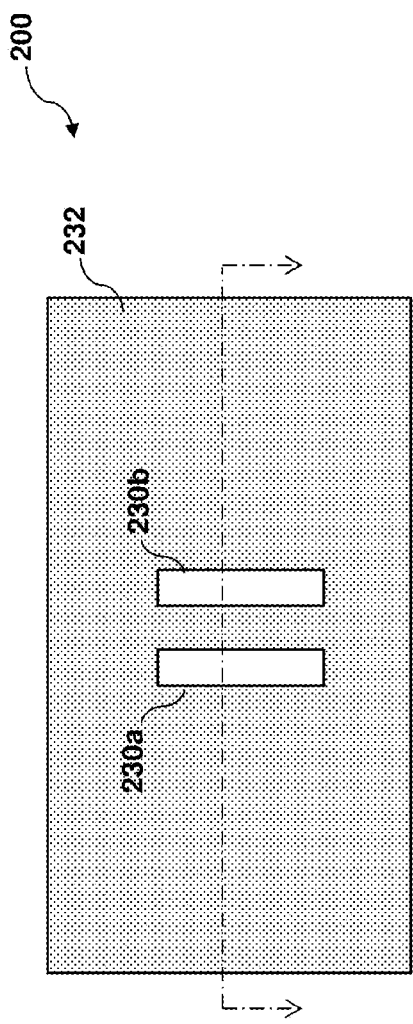
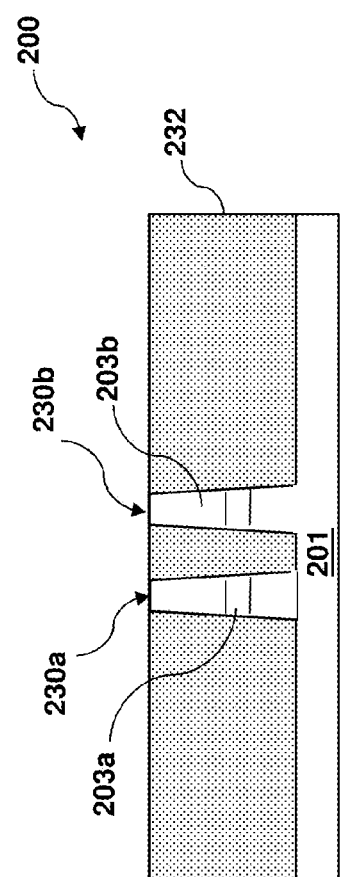
FIG. 11A
FIG. 11B

METHOD OF FABRICATING A FINFET DEVICE

This patent claims the benefit of U.S. Ser. No. 61/777,736 filed Mar. 12, 2013, the entire disclosure of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of a feature is scaled down, an overlay error margin is also reduced when performing a fin cut process while fabricating a fin field effect transistor (FinFET) device. The reduced overlay error margin becomes increasing difficult to manage. Accordingly, what is needed is a method for performing the fin cut process within the overlay margin error.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-11B are top and cross sectional views of forming a device according to the method of FIG. 1.

DETAILED DESCRIPTION

Figure 1:
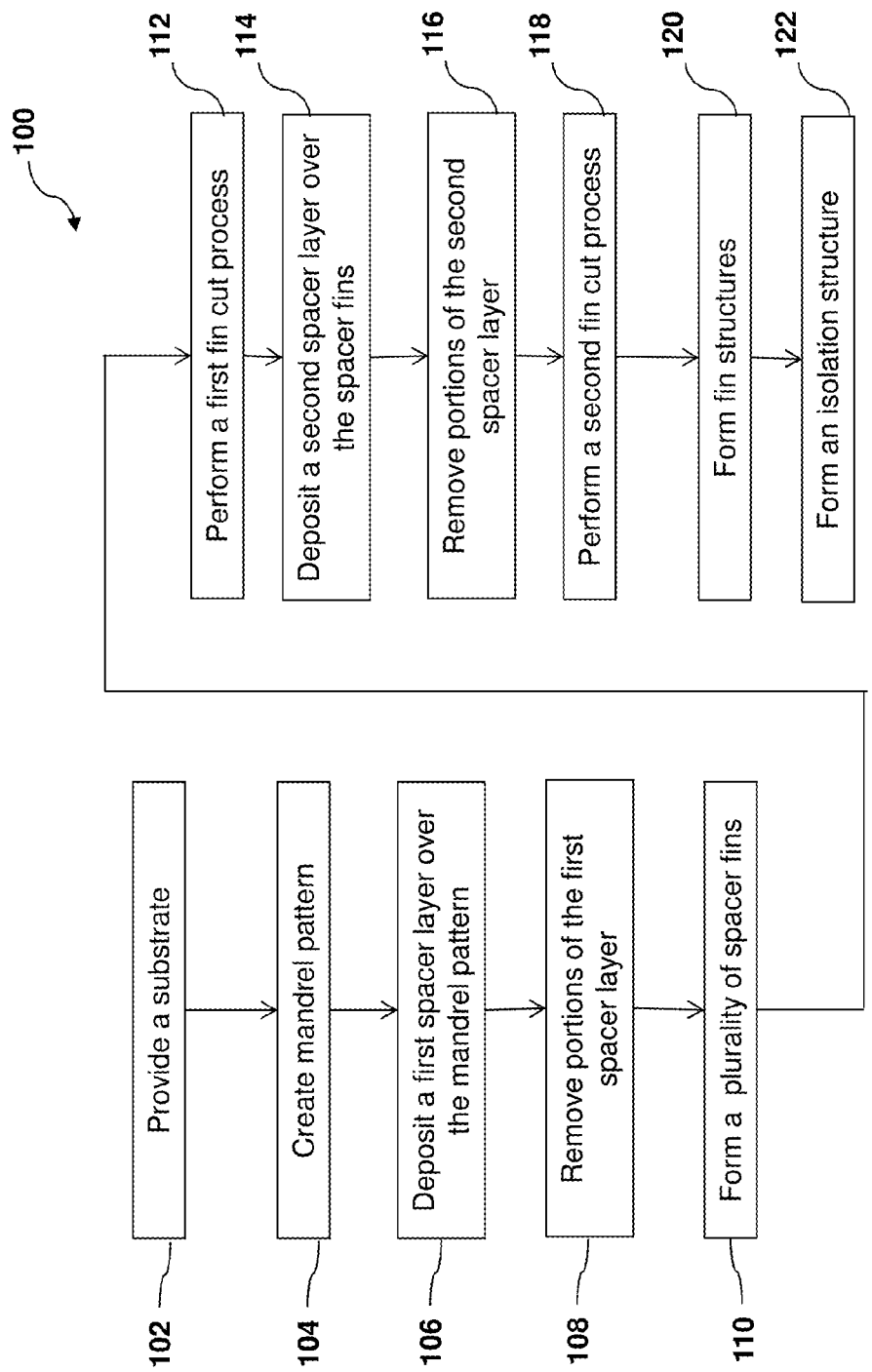
FIG. 1 is a flow chart of a method of fabricating a device for implementing one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a flow chart of a method 100 for fabricating a device is illustrated. It is understood that additional steps can be provided before, during, and after the method 100, and some steps described can be replaced, eliminated, or moved around for additional embodiments of the method. The method 100 will be further described below, and more specific embodiments of forming an example device 200, as shown in FIGS. 2-11B. The method 100 is an example, and is not intended to limit the present disclosure beyond what is explicitly recited in the claims.

The method 100 begins at step 102 by providing a substrate. Referring to FIG. 2, the device 200 includes a semiconductor layer 201, a pad oxide layer 203a, a silicon nitride (SiN) layer 203b, a first amorphous carbon (APF) layer 204, a first capping layer 206, a second APF layer 207a, and a second capping layer 207b. The layers 201, 203a, and 203b will be collectively referred to as base substrate 202.

In the present embodiment, the semiconductor layer 201 is a silicon wafer. Alternatively or additionally, the semiconductor layer 201 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some embodiments, the layer 201 may include a plurality of layers. The plurality of layers may include a conducting layer, a dielectric layer, or combinations thereof. In one embodiment, the dielectric layer includes silicon oxide, silicon nitride, or silicon oxynitride (SiON). In another embodiment, the dielectric layer may include other suitable high-k or low-k dielectric material. In one example, the plurality of layers includes a pad silicon oxide layer, a silicon nitride layer, an amorphous carbon (APF) layer, and a silicon oxynitride layer.

The capping layers 206, 207b may be formed of various materials, such as SiON. Also, the capping layer 206 may include a different material than layer 207b, and the first amorphous silicon layer 204 may include a different material than layer 207a. Different materials support different etch selectivities, which can be used in one or more embodiments discussed below.

The method 100 proceeds to step 104 by creating a mandrel pattern over the device. Referring to FIG. 2, the device 200 includes a dummy mandrel 209, also referred to as a sacrificial mandrel. In the present embodiment, the dummy mandrel 209 is a hard mask. The hard mask may include materials such as silicon oxide, silicon nitride, or silicon oxynitride. Other suitable materials are possible. One way of forming the hard mask includes using a deposition process, such as a CVD or a PVD process, and a patterning process, such as photolithography.

In the present embodiments, the dummy mandrel pattern 209 is used as a hard mask to etch the second capping layer 207b and the second APF layer 207a to form a mandrel pattern 208, as shown in the FIG. 3. Various types of etchant processes may be used, including wet etch or dry etch. Each of the mandrel patterns 208 has a first dimension D1 and a first pitch 2P.

The method 100 proceeds to step 106 by depositing a first spacer layer over the mandrel patterns. Referring now to FIGS. 4A (top view) and 4B (cross section view), a first spacer layer 212 is deposited over the mandrel patterns 208 (individually designated 208a-d) formed over the first capping layer 206. The first spacer layer 212 may include a dielectric material, such as silicon oxide, silicon nitride, or silicon oxynitride. Forming the first spacer layer 212 includes using a deposition process, such as a CVD or a PVD process.

Figure 5A:
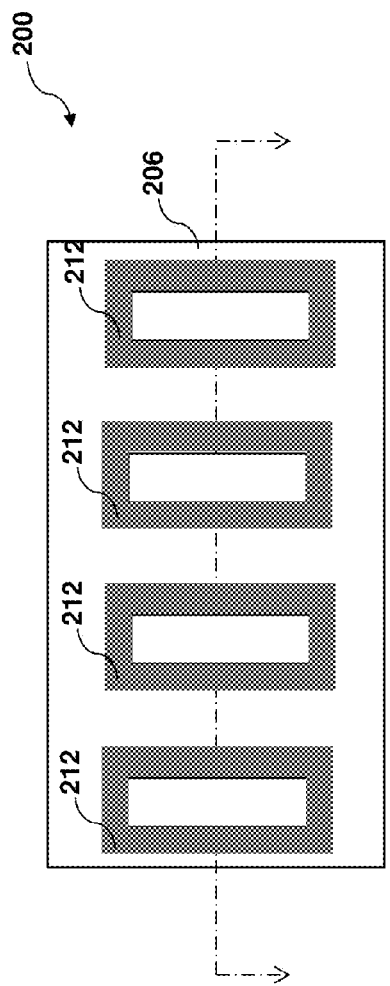

The method 100 proceeds to step 108 by removing portions of the first spacer layer. In one embodiment, this is done by performing an anisotropic etch process so that the first spacer layer only remains on sidewalls of the hard mask pattern. Referring now to FIGS. 5A (top view) and 5B (cross sectional view), portions of the first spacer layer 212 disposed over the top of the hard mask patterns 208a-d are removed, portions of the first spacer layer 212 disposed over the surface of the capping layer 206 are also removed, and the first spacer layer 212 only remains on sidewalls of the hard mask patterns 208a-d. In the present embodiment, removing portions of the first spacer layer 212 includes using a plasma etching process.

Figure 5B:
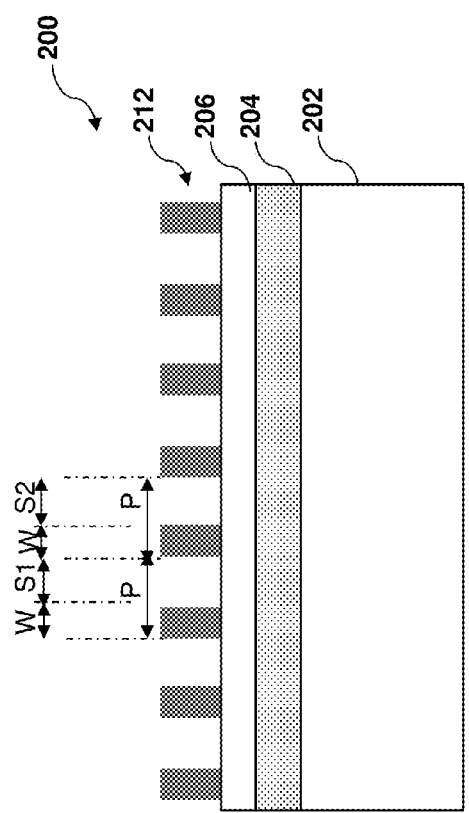

The method 100 proceeds to step 110, where a plurality of spacer fins are formed. As shown in FIGS. 5A and 5B, the mandrel 209 is removed. This can be done by one or more conventional processes, such as wet etch, and dry etch. Also or in the alternative, the material used in layers 207a and 207b can be specified such that a selective dry etch would remove the mandrels 209 and portions of the first spacer 212 (leaving the material on the sidewalls), but not the layer 206. As a result, only patterned portions of the spacer layer 212 remain. The patterned spacers 212 are referred to as spacer fins, and have a dimension D2 that is less than D1 (FIG. 3).

According to one or more embodiments, with the scaling down of the second pitch P, the shrunk space S between the spacer fins 212 may create a challenge. For example, the shrunk space S between two adjacent spacer fins may not provide sufficient overlay error margin when performing a fin cut process. In the present embodiments, the space S of the spacer fins 212 is increased by increasing the first dimension D1 of the hard mask patterns (FIG. 3). The increased space S between the spacer fins 212 may improve an overlay error margin when performing a fin cut process. For example, the space S is increased by approximate 5 nm and therefore the width W is decreased by approximate 5 nm in order to keep the same pitch. The increasing of the space S can be transferred to an increasing value of an overlay error margin. In one example, an increasing value of 5 nm on the space S can increase an overlay error margin by 5 nm, which is more than a 20% improvement for a semiconductor device having a pitch at 45 nm.

Figure 6A:
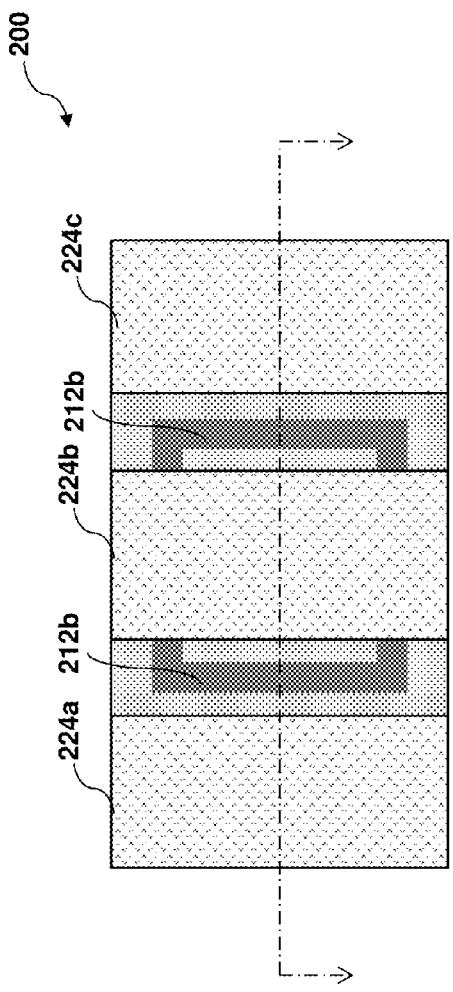
Figure 6B:
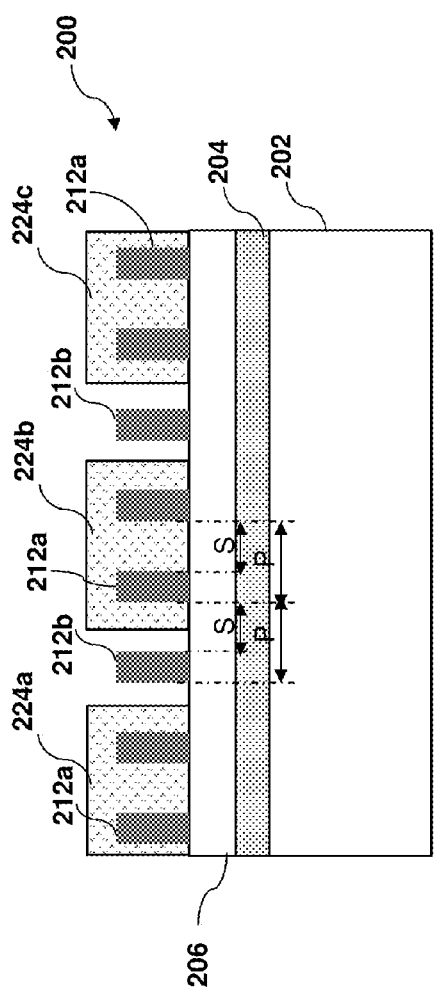
Figure 7A:
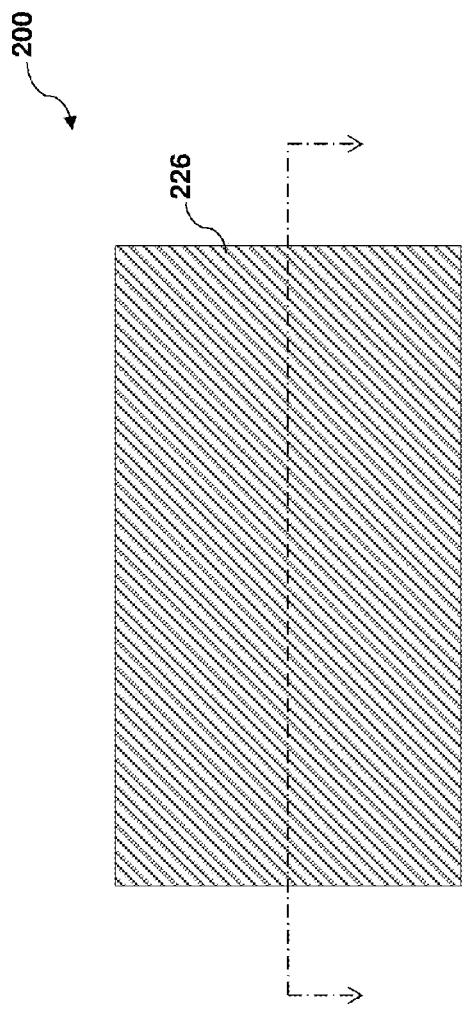
Figure 7B:
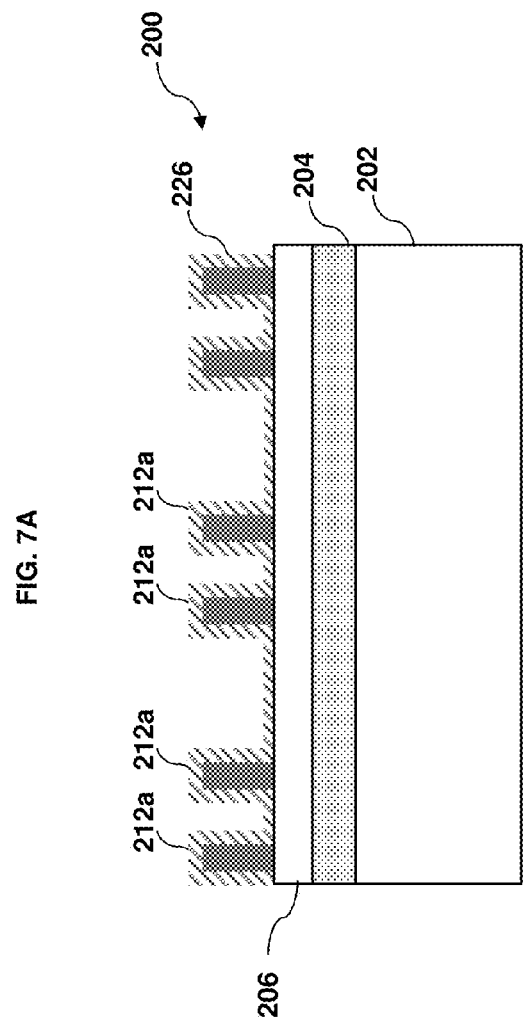

The method 100 proceeds to step 112 by performing a first fin cut process. Referring now to FIGS. 6A (top view) and 6B (cross sectional view), a first resist pattern 224a is formed to protect the spacer fins on the left side of the figure; a first resist pattern 224b is formed to protect the spacer fins in the middle of the figure; and a first resist pattern 224c is formed to protect the spacer fins on the right side of the figure. The protected spacer fins are designated 212a, and the remaining un-protected fins are designated 212b. As shown in FIG. 7B, in one embodiment, the unprotected fins 212b are cut or removed in the first fin cut process, such as by using an etch process.

The method 100 proceeds to step 114 by depositing a second spacer layer over the substrate and the spacer fins 212a. Referring now to FIGS. 7A (top view) and 7B (cross sectional view), a second spacer layer 226 is deposited over the spacer fins 212a and the first capping layer 206. In the present embodiments, the second spacer layer 226 includes a second thickness used to compensate the intentionally decreased width of the spacer fins 212a. In some embodiments, the spacer layer 226 includes a hard mask material, such as silicon oxide, silicon nitride, or silicon oxynitride. Forming the spacer layer 226 includes using a deposition process, such as a CVD or a PVD process.

Figure 8A:
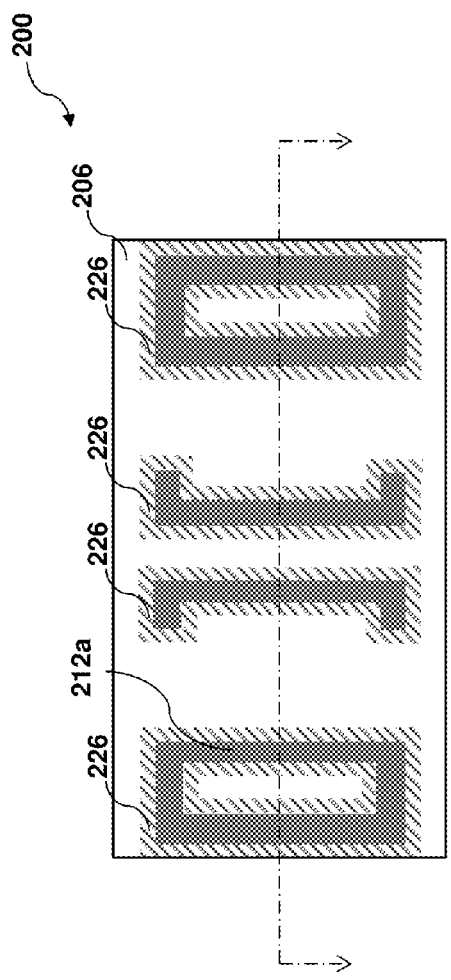
Figure 8B:
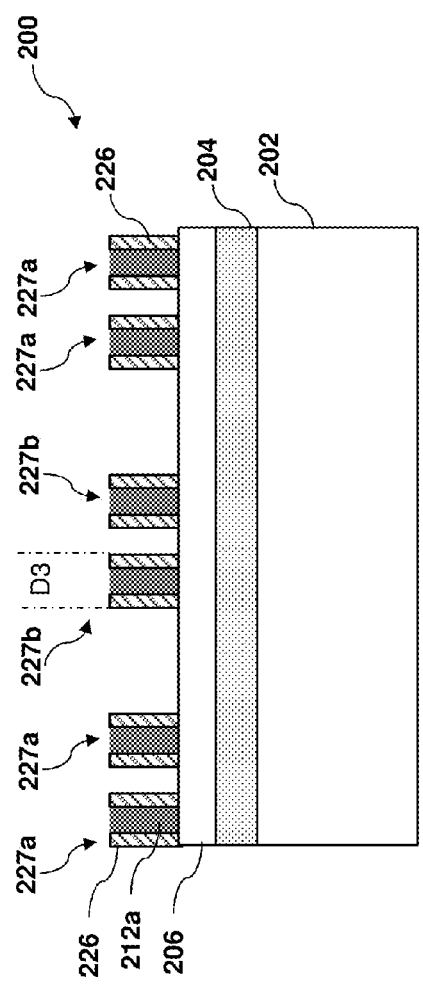

The method 100 proceeds to step 116 by performing an etch back process to remove the second spacer layer disposed over the top of the spacer fin and over the substrate. Referring now to FIGS. 8A (top view) and 8B (cross sectional view), the second spacer layer 226 is removed, except from the sidewalls of the spacer fins 212a. In the present embodiments, the second spacer layer 226 disposed over the top of the spacer fins 212a and over the surface of layer 206 (not occupying by the spacer fins 218a) are removed using an etch back process and/or a cleaning process. The remaining spacers 212a with spacer layer 226, collectively referred to as second spacer fins 227a and 227b, each having a dimension D3 that is larger than D2 (FIG. 5B).

The method 100 proceeds to step 118 by performing a second fin cut process. In the present embodiments, a second fin cut process is also referred to as a coarse cut process. Referring now to FIGS. 9A (top view) and 9B (cross sectional view), a second resist pattern 228 is formed to protect the spacer fins 227b. In one embodiment, the spacer fins 227a are removed or cut during the second fin cut process. Because the spacer fins 212b (FIG. 6B) were previously removed in the first fin cut process, the second resist pattern 228 has a much larger overlay error margin than the first fin cut process. The uncovered or unprotected spacer fins 227a may be removed, or cut, using an etching process or an ion trim process. Performing the second fin cut process also includes using a lithography process and/or cleaning process.

The method 100 proceeds to step 120 by forming a fin structure or a fin feature in the substrate by using the spacer fin as a hard mask. Referring now to FIGS. 10A (top view) and 10B (cross sectional view), fin structures 230a and 230b are formed. In one embodiment, the fin structure 230a and 230b include a single material, such as Si. In another embodiment, the fin structure 230a and 230b include portions of the semi-conductor layer 201, pad oxide layer 203a, SiN layer 203b, the first APF layer 204, and the first capping layer 206. In yet another embodiment, the fin structures 230a and 230b do not include the first APF layer 204 or the first capping layer 206. Forming the fin structure 230a and 230b includes using an etching and a cleaning process.

The method 100 proceeds to step 122 by forming an isolation structure between the fin structures disposed over the substrate. Referring now to FIGS. 11A (top view) and 11B (cross sectional view), an isolation structure 232 is disposed over the substrate 202 with the fin structure 230a and 230b embedded into the isolation structure 232. In some embodiments, the isolation structure 232 includes silicon oxide, silicon nitride, silicon oxynitride, or combinations thereof. Forming the isolation structure 232 may include using a deposition process, such as a CVD or PVD process, a recess etching process, or a CMP process.

In the foregoing discussion, by fabricating a device, various processes, such as a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film over a wafer substrate, exposing the resist film deposited over the wafer substrate by an optical lithography tool or an electron beam writer, and developing the exposed resist film to form a resist pattern for an ion trim process or an etching process. In the present embodiment, a resist is also referred to as a photo resist. A resist may include a positive resist or a negative resist. A resist film may include a single layer resist film or a multiple layer resist film.

One way of coating the resist film over the wafer substrate includes performing a dehydration process before applying the resist film over the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. A different way may also include a soft bake (SB) process to drive a solvent out of a resist film and increase mechanical strength of a resist film. Another alternative way may include applying an antireflective coating, such as a bottom antireflective coating (BARC) or a top antireflective coating (TARC).

Exposing the resist film deposited over the wafer substrate includes using an optical exposing tool or a charged particle exposing tool. The optical lithography tool may include an I-line, a deep ultraviolet (DUV), an extreme ultraviolet (EUV) tool, or an ArF tool. The charged particle exposing tool includes an electron beam or an ion beam tool. The using the optical exposing tool includes using a mask. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film may include a post exposure bake (PEB), a post develop bake (PDB) process, or a combinations thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, present disclosure provides several embodiments of a method for fabricating a semiconductor device, and a device produced by such method. In one embodiment, a method of fabricating a semiconductor device includes receiving a substrate having a first dummy pattern, depositing a first spacer layer over the first dummy pattern, and removing the first spacer layer, except from sidewalls of the first dummy pattern to form a first plurality of spacer fins. A first fin cut process is used to remove at least one of the first spacer fins. After the first fin cut process, the method includes depositing a second spacer layer over the remaining first spacer fins and removing the second spacer layer, except from sidewalls of the remaining first spacer fins to form a second plurality of spacer fins. A second fin cut process is used to remove some, but not all, of the second plurality of spacer fins. A plurality of fin structures are then etched using the remaining second plurality of spacer fins.

In another embodiment, the present disclosure describes a method including receiving a substrate having an etch stop layer deposited over the substrate and a dummy mandrel layer deposited over the etch stop layer, forming a plurality of hard mask patterns using a hard mask layer deposited over the dummy mandrel layer, wherein the hard mask patterns includes a first dimension adjusted by a predetermined value, depositing a first spacer layer over the hard mask patterns, wherein the first spacer layer includes a first thickness adjusted by the predetermined value, forming a plurality of spacer fins in the dummy mandrel layer by using the hard mask patterns, wherein the spacer fins include a second dimension, a first space, and a second space, performing a first fin cut process to remove at least one spacer fin, adjusting the second dimension to a target dimension, performing a second fin cut process, and forming a plurality of fin structures in the substrate by etching the spacer fins. The method further includes forming an isolation structure over the substrate, wherein the isolation structure embeds the fin structures. The substrate includes a plurality of layers so that the fin structures include at least one layer. The first dimension is responsible to the first space. The first thickness is responsible to the second dimension. The first space is equal to the second space. Adjusting the second dimension includes depositing a second spacer layer over the spacer fins. Adjusting the second dimension further includes depositing the third pacer layer over sidewalls of the spacer fins. The second spacer layer includes a second thickness controlled by a predetermined value. Adjusting the second dimension further includes removing the second spacer layer disposed over the top of the spacer fins.

In yet another embodiment, the present disclosure describes a method including receiving a substrate having a plurality of layers, depositing an etch stop layer over the substrate and a dummy mandrel layer over the etch stop layer, forming a plurality of hard mask patterns using a hard mask layer deposited over the dummy mandrel layer, wherein the hard mask patterns includes a first dimension adjusted by a predetermined value, depositing a first spacer layer over the hard mask patterns, wherein the first spacer layer includes a first thickness adjusted by the predetermined value, forming a plurality of spacer fins including a space and a width by using the hard mask patterns, wherein the space is a function of the first dimension and the width is a function of the first thickness, performing a first fin cut process to remove at least one spacer fin, adjusting the width to a target dimension by depositing a second spacer layer over the spacer fins, wherein the second spacer layer includes a second thickness controlled by the predetermined value, performing a second fin cut process, and forming a plurality of fin structures in the substrate.

In still another embodiment, the present disclosure describes a method including receiving a substrate having a plurality of layers, depositing an etch stop layer over the substrate and a dummy mandrel layer over the etch stop layer, forming a plurality of hard mask patterns using a hard mask layer disposed over the dummy mandrel layer, wherein the hard mask patterns include a first dimension increased by a predetermined value, depositing a first spacer layer over the hard mask patterns, wherein the first spacer layer includes a first thickness decreased by the predetermined value, forming a plurality of spacer fins including a space and a width, wherein the space is increased by the predetermined value and the width is decreased by the predetermined value, performing a first fin cut process to remove at least one spacer fin by using a first resist pattern, adjusting the width to a target dimension by depositing a second spacer layer over the spacer fins, wherein the second spacer layer includes a second thickness controlled by the predetermined value, performing a second fin cut process by using a second resist pattern, and forming at least two fin structures in the substrate by using the remained spacer fins. The method further includes performing an anisotropic etching process to remove the first spacer layer disposed over the top of the spacer fins. Forming at least two fin structures includes etching with the spacer fins into the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   receiving a substrate having a first dummy pattern;
   depositing a first spacer layer over the first dummy pattern;
   removing the first spacer layer, except from sidewalls of the first dummy pattern to form a first plurality of spacer fins;
   performing a first fin cut process to remove at least one of the first spacer fins;
   after the first fin cut process, depositing a second spacer layer over the remaining first spacer fins;
   removing the second spacer layer, except from sidewalls of the remaining first spacer fins to form a second plurality of spacer fins;
   performing a second fin cut process to remove some, but not all, of the second plurality of spacer fins; and
   etching fin structures using the remaining second plurality of spacer fins.

2. The method of claim 1, further comprising forming an isolation structure over the substrate, wherein the isolation structure embeds the fin structures.

3. The method of claim 1, wherein the substrate includes a plurality of layers so that the fin structures include at least one layer.

4. The method of claim 1, wherein the substrate includes a first material, and wherein the fin structures include the first material.

5. The method of claim 4, wherein the fin structures include a pad oxide layer over the first material.

6. The method of claim 4, wherein the fin structures include a silicon nitride layer over the first material.

7. The method of claim 4, wherein the fin structures include an amorphous carbon layer (APF) over the first material.

8. The method of claim 4, wherein the fin structures include a capping layer over the first material.

9. The method of claim 4, wherein the fin structures include at least one of a silicon oxide layer, a silicon nitride layer, or a silicon oxynitride layer over the first material.

10. The method of claim 1, wherein the fin structures include at least one of a pad oxide layer, a silicon nitride layer, and an amorphous carbon layer (APF).

11. A method of forming a semiconductor device, the method comprising:
    receiving a substrate having a plurality of layers;
    depositing an etch stop layer over the substrate and a dummy mandrel layer over the etch stop layer;
    forming a plurality of hard mask patterns using a hard mask layer deposited over the dummy mandrel layer, wherein the hard mask patterns include a first dimension adjusted by a predetermined value;
    depositing a first spacer layer over the hard mask patterns, wherein the first spacer layer includes a first thickness adjusted by the predetermined value;
    forming a plurality of spacer fins including a space and a width by using the hard mask patterns, wherein the space is a function of the first dimension and the width is a function of the first thickness;
    performing a first fin cut process to remove at least one spacer fin;
    adjusting the width to a target dimension by depositing a second spacer layer over the spacer fins, wherein the second spacer layer includes a second thickness controlled by the predetermined value;
    performing a second fin cut process; and
    forming a plurality of fin structures in the substrate.

12. The method of claim 11, wherein the plurality of layers include silicon oxide, silicon nitride, silicon oxynitride layer, or combinations thereof.

13. The method of claim 11, wherein the etch stop layer includes silicon oxide, silicon nitride, silicon oxynitride layer, or combinations thereof.

14. The method of claim 11, wherein the dummy mandrel layer includes silicon oxide, silicon nitride, silicon oxynitride layer, or combinations thereof.

15. The method of claim 11, wherein the hard mask layer includes silicon oxide, silicon nitride, silicon oxynitride layer, or combinations thereof.

16. The method of claim 11, wherein the first spacer layer includes silicon oxide, silicon nitride, silicon oxynitride layer, or combinations thereof.

17. The method of claim 11, wherein the second spacer layer includes silicon oxide, silicon nitride, silicon oxynitride layer, or combinations thereof.

18. A method of forming a fin structure, the method comprising:
    receiving a substrate having a plurality of layers;
    depositing an etch stop layer over the substrate and a dummy mandrel layer over the etch stop layer;
    forming a plurality of hard mask patterns using a hard mask layer disposed over the dummy mandrel layer, wherein the hard mask patterns include a first dimension increased by a predetermined value;
    depositing a first spacer layer over the hard mask patterns, wherein the first spacer layer includes a first thickness decreased by the predetermined value;
    forming a plurality of spacer fins including a space and a width, wherein the space is increased by the predetermined value and the width is decreased by the predetermined value;
    performing a first fin cut process to remove at least one spacer fin by using a first resist pattern;
    adjusting the width to a target dimension by depositing a second spacer layer over the spacer fins, wherein the second spacer layer includes a second thickness determined by the predetermined value;
    performing a second fin cut process by using a second resist pattern; and
    forming a plurality of fin structures in the substrate by using the spacer fins.

19. The method of claim 17, further comprising performing an anisotropic etching process to remove the second spacer layer disposed over a top of the spacer fins.

20. The method of claim 18, wherein forming at least two fin structures includes etching with the spacer fins into the substrate.

* * * * *